United States Patent
Kaito

(10) Patent No.: US 7,326,445 B2
(45) Date of Patent: Feb. 5, 2008

(54) METHOD AND APPARATUS FOR MANUFACTURING ULTRA FINE THREE-DIMENSIONAL STRUCTURE

(75) Inventor: Takashi Kaito, Mihama-ku (JP)

(73) Assignee: SII NanoTechnology Inc. (JP)

( * ) Notice: Subject to any disclaimer, the term of this patent is extended or adjusted under 35 U.S.C. 154(b) by 409 days.

(21) Appl. No.: 10/220,895

(22) PCT Filed: Nov. 27, 2001

(86) PCT No.: PCT/JP01/10346

§ 371 (c)(1),
(2), (4) Date: Feb. 27, 2003

(87) PCT Pub. No.: WO02/44079

PCT Pub. Date: Jun. 6, 2002

(65) Prior Publication Data

US 2003/0161970 A1    Aug. 28, 2003

(30) Foreign Application Priority Data

Nov. 29, 2000  (JP)  .............................. 2000-363573

(51) Int. Cl.
C23C 16/26 (2006.01)
C23C 16/48 (2006.01)
C23C 14/48 (2006.01)

(52) U.S. Cl. ...................... 427/585; 427/525; 427/595; 427/249.1

(58) Field of Classification Search ................ 427/523, 427/524, 525, 530, 531, 561, 562, 564, 577, 427/594
See application file for complete search history.

(56) References Cited

U.S. PATENT DOCUMENTS

| | | | | |
|---|---|---|---|---|
| 4,724,106 A * | 2/1988 | Morimoto et al. | .......... | 264/439 |
| 6,417,512 B1 * | 7/2002 | Suzuki | .............. | 250/307 |
| 6,527,967 B1 * | 3/2003 | Suzuki | .............. | 216/62 |
| 6,544,897 B2 * | 4/2003 | Kaito | .............. | 438/710 |
| 6,685,847 B2 * | 2/2004 | Sadayama | .............. | 216/37 |
| 6,686,600 B2 * | 2/2004 | Sadayama | .............. | 250/492.21 |
| 6,797,952 B2 * | 9/2004 | Kaito et al. | .............. | 250/306 |
| 6,864,481 B2 * | 3/2005 | Kaito et al. | .............. | 250/306 |
| 7,235,783 B2 * | 6/2007 | Kaito | .............. | 250/310 |
| 2004/0074288 A1 * | 4/2004 | Shirakawabe et al. | ......... | 73/105 |
| 2004/0129351 A1 * | 7/2004 | Iwasaki | .............. | 148/508 |
| 2005/0066882 A1 * | 3/2005 | Fujita et al. | .............. | 117/68 |
| 2005/0079120 A1 * | 4/2005 | Fujita et al. | .............. | 423/448 |
| 2007/0176099 A1 * | 8/2007 | Kaito | .............. | 250/306 |
| 2007/0205376 A1 * | 9/2007 | Kaito | .............. | 250/435 |

FOREIGN PATENT DOCUMENTS

JP    53-114677    * 10/1978

* cited by examiner

*Primary Examiner*—Marianne Padgett
(74) *Attorney, Agent, or Firm*—Adams & Wilks

(57) ABSTRACT

A method is adopted for deposition technology using a focused ion beam device, characterized by enabling structures to be formed by using phenanthrene as a source gas and using ions of gallium or gold, silicon or beryllium etc. of energies of 5 to 100 keV from a liquid-metal ion source as ions so as to give a gas blowing density of five to ten times greater than the case of deposition in the related art, with directionality of the gas blowing being both isotropic and symmetrical.

23 Claims, 4 Drawing Sheets

7 SAMPLE FOUNDATION

CENTER OF CIRCULAR SCANNING

125nm

D

BEAM CENTER

CENTER OF CIRCULAR SCANNING

DD DRILL

7 SAMPLE FOUNDATION

METHOD AND APPARATUS FOR MANUFACTURING ULTRA FINE THREE-DIMENSIONAL STRUCTURE

FIELD OF THE INVENTION

This invention relates to technology for forming ultra-fine three-dimensional structures using CVD techniques where source gas is blown onto a sample surface and the sample surface is irradiated with a focused ion beam.

BACKGROUND ART

Knifes and drills, manipulator probes, spring coils, probe microscope styli, and coils used with finely detailed electronic circuitry used in processing of microscopy samples are required in a wide range of fields, and great expectations are placed upon such manufacturing technology with regards to manufacturing ultra-fine three-dimensional structures. In the conventional manufacture of these types of ultra-fine three-dimensional structures, trials have been made whereby blocks of material etc. are formed using mechanical processing and are then cut using sputter-etching techniques. This method is relatively straightforward if the subject of manufacture is linear in shape such as is the case with a manipulator probe or probe microscope stylus, but is extremely complex in the case of a three-dimensional shaped item such as a drill or coil, etc.

Further, in addition to the aforementioned sputter-etching techniques and also in addition to other methods for removing material such as gas assisted etching and chemical etching techniques, processes of adhesion to materials referred to as CVD (Chemical Vapor Deposition) techniques are also used as fine processing technology for semiconductor devices and masks etc. used in the manufacture of such semiconductor devices. Technology for forming ultra-fine three-dimensional structures using CVD techniques is also being developed amongst researchers. There are methods employing laser beams, focused electron beams and focused ion beams as the beams for use in the CVD techniques. With deposition using CVD techniques, the dimensions of accumulated portions depend on the beam diameter and it is therefore necessary for beam diameter to be narrow in the manufacture of these kinds of ultra-fine three-dimensional structures. When laser light is used, there are limitations due to the beam diameter and wavelength coming from the characteristics of the light itself which makes deflecting the beam to give the desired scanning mechanically difficult. There is therefore not only the troublesome operation of having to axially move the sample stage as the irradiation position changes, but there is also a problem that the response speed is slow. Beam focusing and beam deflection scanning are relatively straightforward for electron beams and ion beams that employ magnetic means and can therefore be said to be suited to manufacture of this type of ultra-fine three-dimensional structure. However, when a focused electron beam is used, irradiated electrons pass through the material target on which it is wished to deposit the irradiated electrons due to the characteristics of electrons such as particle mass and particle diameter, resulting in a problem where it is difficult to perform deposition at the desired locations which accompanies the phenomena of depositing at locations where deposition is not desired. Taking the above collectively, methods employing a focused ion beam are most appropriate in the construction of ultra-fine three-dimensional structures. Researchers are therefore currently performing various trials with respect to research into the use of focused ion beams.

A description is given using FIG. 4 of deposition using a focused ion beam device. Numeral 1 indicates an ion source. Ions are extracted by applying a voltage to electrodes taken from the ion source 1 and these ions are brought into a beamshape by an ion optical system 3, are deflected by a deflection operation of a deflector, and are made to irradiate desired locations of a surface of a sample 7 mounted on a sample stage 4. Source gas is blown from a gas gun 6 in the direction of the vicinity of the surface of the sample to be subjected to deposition. In doing so, an attractive layer of blown source gas can be formed at the surface of the region of the sample 7 so that when a focused ion beam 2 is irradiated, ions and the source gas react with each other so that a certain product material, i.e., a volatile product material, is deposited on the surface of the sample. When the focused ion beam 2 is made to scan a prescribed region of the sample 7 by the deflector, deposited matter forms a thin film at this region. Deposition employing focused ion beam devices is used in the forming of protective films for providing protection with regards to damage to the surroundings when processing semiconductor devices, etc. using sputtering etching and gas-assisted etching employing focused ion beams and in the correction of white defects (void defects) in semiconductor devices and photomasks, etc.

Researchers are developing technology to cultivate materials in a horizontal direction in research processes for implementing bridging of void defects in the field for correcting white defects of the aforementioned semiconductor devices and photomasks, etc. This technology has been disclosed previously in Japanese Patent Application No. 2000-333368 titled "Beam-Shaped Film Pattern Forming Methods". With this technology, deposition is executed gradually with respect to a channel-shaped defect of the element at a strip-shaped irradiation region from an end of the channel so that a deposition layer is grown in a central direction while moving the center of an opening of the irradiation region. This phenomena then forms an inclined surface at the tip side of the deposition layer D as shown in FIG. 3. Formation of the sloping surface is performed by sequentially advancing attachment from the ends, because at the time of initial irradiation there is no foundation to become attached to at the tip side of the irradiation region. However, if a temporary foundation is possible, it becomes possible to form a deposition layer D on this base and if the time of irradiation to the same region is made longer, the deposition layer D does not simply become thicker, as shown by the dashed line b in FIG. 3A, but the sloping surface disappears and becomes instead a flat deposition surface. In that way, an edge of the deposition layer D on a growth tip side rises up, and if the irradiation region is subsequently shifted and a deposition layer formed, the next deposition layer grows as a step shape upwards and in the tip direction, as shown in FIG. 3C. In the invention of the previous application, when the tip side of the deposition layer D is being formed in a ledge shape, the irradiation region is shifted to the tip side so as to overlap the sloping surface portion, and deposition is performed again. The deposition layer D is also formed having a sloping surface the second time, as shown by the dashed line a in FIG. 3A. At the point in time when this state is reached, the irradiation region is again shifted to the tip side, and the deposition layer D is sequentially grown on the tip side. Film formation using this method does not produce a stepped shape for the deposition layer of each strip, as shown in FIG. 3B, and it is possible to form a fixed length cantilever beam shaped body positioned at the lower surface. It is also possible to grow directly alongside with a thin film thickness of ten times or more and it has been conformed that this thickness can be formed in a flat and uniform manner.

It is therefore the object of the present invention to provide technology for forming ultra-fine three-dimensional structures using CVD techniques where a source gas is blown onto a sample surface which is then irradiated with a focused ion beam in a straightforward and rapid manner without the necessity of troublesome operations.

Technology is also provided for eliminating ion elements remaining within the sample irradiated with an ion beam during this processing.

SUMMARY OF THE INVENTION

The present invention adopts a method for deposition technology using a focused ion beam device, characterized by enabling structures to be formed by using phenanthrene as a source gas and using ions of gallium or gold, silicon or beryllium etc. of energies of 5 to 100 keV from a liquid-metal ion source as ions so as to give a gas blowing density of five to ten times greater than the case of deposition in the related art, with directionality of the gas blowing being both isotropic and symmetrical.

A detailed description is given here of "making gas blowing density five to ten times greater than with related art deposition".

1. An example is given as an example of related carbon deposition using a focused ion beam where pyrene ($C_{16}H_{10}$) is used as the source gas. This is an example used in the forming of a light blocking film for correction of white defects of photomasks for optical lithography. Pyrene is selected in this case because of the importance of light blocking efficiency. However, pyrene becomes easily deposited on the sample surface when the blowing density is increased.

Deposition of the blown gas is not good in the case of deposition using a focused ion beam.

2. It can therefore be confirmed that, on this occasion, phenanthrene ($C_{14}H_{10}$) is preferable because speed of growth of thickness of the deposition film is important in the selection of the gas species. Comparing vapor pressure at room temperature, that of phenanthrene is a decimal place higher than that of pyrene. Therefore, when phenanthrene is taken as the source gas, blowing density can be increased by a decimal place higher than the case of pyrene without source gas deposition problems occurring.

This means that the speed of growth of the deposition film thickness can be increased by the order of approximately one decimal place from that of the related art up to 100 nm/sec. Further, when beam current is a small current in the order of less than a few pA, deposition is possible with the beam scan being halted or being extremely slow. This is because the density of the incident gas can be increased to a level that can compete with the density of the incident beam.

3. If the vapor pressure is just to be high, then naphthalene ($C_{10}H_8$) should be the most appropriate source gas.

However, with naphthalene, speed of growth of the deposition film thickness falls even if the blowing density is made a decimal place or more higher than phenanthrene.

The reason for this can be considered to be because the probability of attraction to the surface of a naphthalene sample is more than one decimal place lower.

4. From the above results of experimentation, blowing density can be increased by a decimal place higher than the case of pyrene without source gas deposition occurring at the sample surface by making the source gas phenanthrene. This means that the speed of growth of the deposition film thickness can be increased by the order of approximately one decimal place from that of the related art up to 100 nm/sec.

The blowing density of the phenanthrene can be controlled to be a prescribed value by raising the temperature of the source gas container. A method for deciding the blowing density at the sample surface is to at one time confirm deposition by raising the temperature of the source gas container to greater than a prescribed temperature and then lower the temperature to find a critical temperature where deposition no longer occurs. The temperature is then set to a temperature a few degrees lower than this temperature.

Whether or not there is deposition can be decided according to whether or not a blowing density corresponding to vapor pressure of a source gas at the sample temperature is exceeded. It is then necessary to keep the sample temperature at the temperature at the time of the above test. If the temperature is set to a few degrees below the critical temperature for deposition as described above, it is then sufficient just to control the temperature of the room. It is also possible to introduce a mechanism for controlling the sample temperature at the focused ion beam device to be a temperature higher than room temperature, depending on the case.

It is also possible to form a three-dimensional structure 0.08 μm in diameter by putting the beam current to 1 pA or less, halting the scanning, and pausing the beam.

A sample stage that can be driven along five axes (x, y, z directions, rotation direction, and inclination direction) is adopted as a focused ion beam device, a region of the sample that is irradiated with an ion beam is shifted according to the direction of growth of the sample, and in order to adjust the focal point of the beam in line with the region being processed according to growth, first, an ion optical system is controlled, with the stage being driven when this range is exceeded so as to form a three-dimensional structure.

It is also possible to form layers of desired material by subjecting the three-dimensional structure formed using the method of the present invention to plating or other CVD techniques.

BRIEF DESCRIPTION OF THE DRAWINGS

FIG. 1 is a view showing an example of generating an ultra-fine three-dimensional structure using the method of the present invention, where

FIG. 2 is a view showing an example of generating an ultra-fine three-dimensional drill structure using the method of the present invention, where

DETAILED DESCRIPTION OF THE INVENTION

Figure 3A:
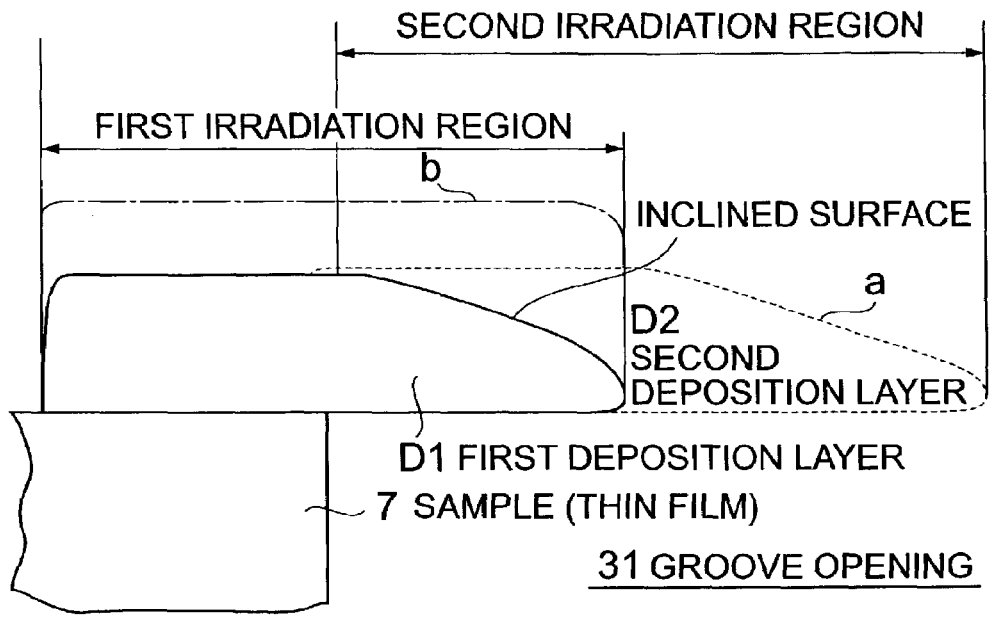
FIG. 3 is a view illustrating deposition phenomena utilizing a focused ion beam that is the foundation of the present invention.
Figure 3B:
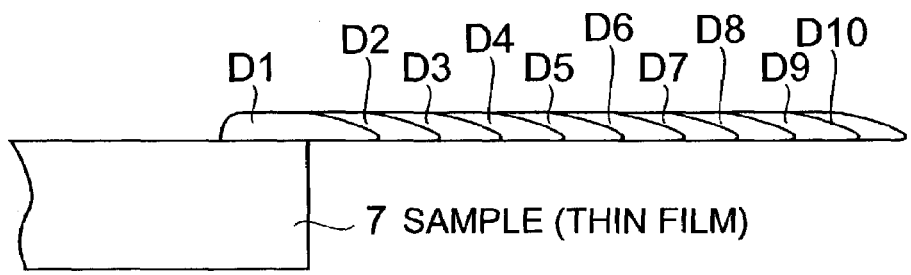

The present invention is based on the aforementioned knowledge, and as such, when deposition is executed gradually with respect to the channel-shaped defect of the element at a strip-shaped irradiation region from an end of the channel so that a deposition layer is grown in a central direction while moving the center of an opening of the irradiation region, an inclined surface is formed on the tip side of the deposition layer as shown in FIG. 3. However, if a temporary foundation is possible, it becomes possible to form a deposition layer on this base and if the time of irradiation to the same region is made longer, the deposition layer does not simply become thicker, as shown by the dashed line b in FIG. 3A, but the sloping surface disappears and becomes instead a flat deposition surface.

Figure 3C:
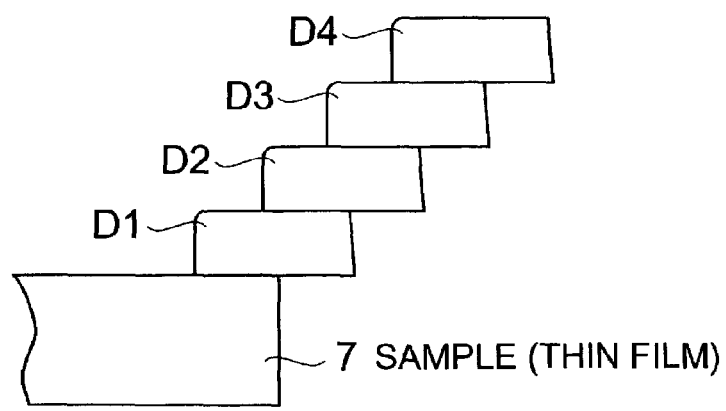
Figure 4:
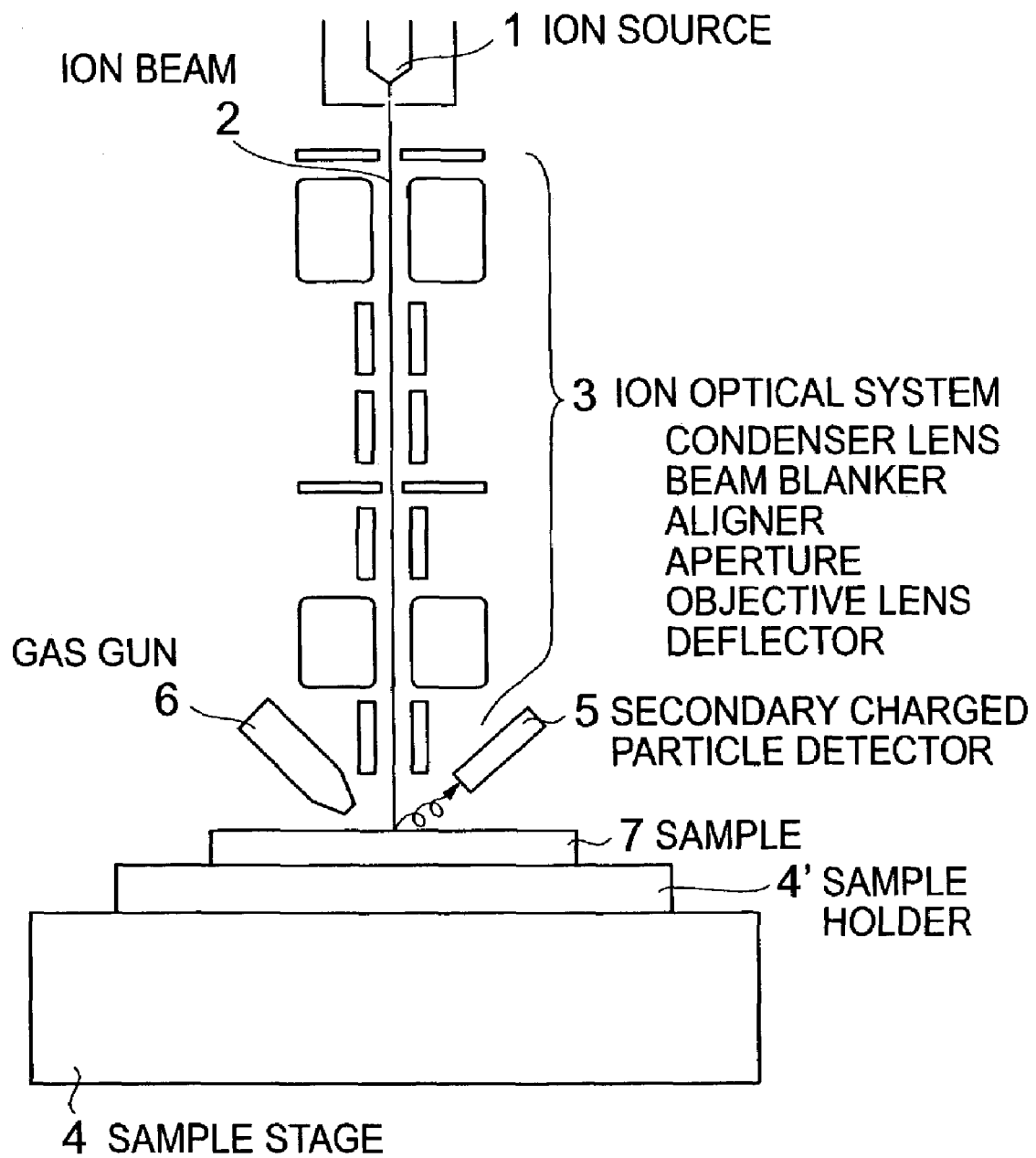
FIG. 4 is a view illustrating a typical structure for a focused ion beam device.

In this way, it is then known that an edge of the deposition layer on a growth tip side rises up, and if the irradiation region is subsequently shifted and a deposition layer formed, the next deposition layer grows as a step shape upwards and in the tip direction, as shown in FIG. 3C, which is an undesired formation. Based on this phenomena, the inventor forms a deposition layer at a microscopic region on the foundation using deposition technology employing a focused ion beam device. Growth in an upward direction of the deposition layer is then achieved by overlaid irradiation of the ion beam on the deposition layer and growing of the deposition having a component in a lateral direction is then also performed.

The inventor has tried out various ways of forming deposition layers by blasting out various source gases from a gas gun while using a focused ion beam device such as various metal deposition employing organic metal gases such as tungsten deposition employing W(CO)6, WF6, molybdenum deposition employing Mo(CO)6, iron/nickel/aluminum deposition employing Fe(CO)5, Ni(CO)5, Al(CO)5, or carbon deposition using organometallic gases such as pyrene, styrene and phenanthrene, etc. As a result, it was found that phenanthrene formed a deposition layer the most rapidly. The focused ion beam used during this time is a beam of Ga ions of an energy of 30 keV but the same results are also confirmed when using ions of gold, silicon or beryllium of an energy of 5 to 100 keV.

Here, phenanthrene gas is used as the source gas in order that the deposition film is grown quickly. This requires a return to the theory of deposition using a focused ion beam (FIB) but this theory will be described separately from the process. This process is for convenience in order to enable ease of understanding.

(1) First, a process is performed to blow source gas including the element to be deposited onto the sample at the FIB irradiation region so that an attraction layer is formed.

This attraction layer must not have a multi-layer structure. This is because a film that is the source gas component as is grows over the whole surface when the film is a multi-layer attraction layer. The conditions for ensuring that no multi-layer attraction film results are that the density at which the attracted gas flies off should be higher than the incident density of the blown gas. This is the case if the vapor pressure of the source gas occurring at the temperature (normally room temperature) during execution is higher than a prescribed value (a vapor pressure corresponding to the blowing density of the source gas). Although this goes without saying, it is necessary to blow source gas at a high density in order to rapidly grow a film. It is preferable for the vapor pressure of the source gas to be high in order to satisfy the aforementioned condition that the attraction film is not to be multi-layer.

On the other hand, high speed deposition is also not possible with source gases where the evaporation may be high but where evaporation takes place soon without the blown gas forming a single layer attraction layer. The conditions necessary as a reference for selecting the source gas are therefore that the element it is wished to form a film of is included, while at the same time evaporation pressure is high, and a single layer attraction layer can be easily formed.

(2) A process for breaking down and polymerizing the source gas attraction layer using an FIB so as to form a deposition film.

In the process (1), when the FIB is incident as a spot when the source gas is being attracted (ideally this is single layer attraction but may also be attraction less than single layer attraction), secondary electrons are generated due to mutual interaction between the attraction layer and the substrate. These secondary electrons cause the source gas attraction layer to break up and polymerize, and a deposition layer is formed. The diameter of this deposition film is larger than the diameter of the beam spot. The reason for this is that the FIB is scattered within the material so as to be broadened so that the range of secondary electrons generated by the scattered ions is in turn broadened.

Experimentation by the inventor has determined that the beam diameter can be narrowed to 7 nm when the current for a 30 keV beam of gallium ions is taken to be 0.4 pA. Source gas of phenanthrene is blown from a gas gun onto the substrate. The temperature of the container generating the source gas within the gas gun is made to be 20 degrees higher than is normal during carbon deposition, and is located on the opposite side facing the gas gun so as to target the direction of blowing of the gas. The internal diameter of the nozzle of the tip of the gas gun is 0.3 mm and the distance between the sample surface and the gas nozzle is 0.1 mm. The density with which the gas is blown is therefore in the region of ten times greater than during normal carbon deposition.

The rise in sample chamber pressure when a valve of the gas gun is opened is in the order of 5.10 to 5 Pa. Under these conditions, the diameter of the deposition film formed by the spot beam is 80 nm. From this experimental data, in the case of a 30 keV gallium beam, broadening of the region to outside of the incident beam diameter due to scattering within the sample (carbon, silicon) and generation of secondary electrons can be considered to be in the order of 36 nm on each side. This value substantially coincides with the estimations for simulations, etc.

Next, when the phenanthrene unit layer attraction film is completely broken down and polymerized to give a carbon film, what happens to the thickness can simply be calculated. The deposition film is an amorphous carbon film where, calculating taking the specific gravity as being the same as for graphite, the thickness becomes 0.54 nm. Phenanthrene is particularly preferable for high-speed film growth due to a large number of carbon atoms (14) being included in one molecule.

Hexacarbonyltungsten that is the source gas in the case of tungsten deposition has one tungsten atom per one molecule. Further, because the specific gravity of the source gas is small and the specific gravity of the tungsten film is large, even if the single layer attraction film of source gas is completely broken down to give a tungsten film, this is only 0.044 nm thick, which is a thickness of 8% compared with the case of a carbon film from phenanthrene. As a result, it is therefore difficult to make the film growing speed high in the case of tungsten deposition even if the density of blowing the source gas is made correspondingly high.

From the above, it is then understood that there is a high possibility that aromatic hydrocarbons, which include a large number of carbon atoms in one molecule and which have a relatively high vapor pressure at room temperature, are appropriate as a source gas providing high film growth speed. Bearing in mind conditions for a fixed body in that control of the blowing density using the heating temperature needs to be straightforward, in addition to phenanthrene, pyrene and naphthalene are also candidates. Putting in order of highest vapor pressure, then the order is naphthalene, phenanthrene and pyrene.

It was understood through experimental comparison that phenanthrene is the most suitable of these candidates.

In the case of naphthalene, the density of introduced gas is high but vaporization also takes place rapidly and a single layer attraction film is therefore not formed. It can therefore be confirmed that in the case of phenanthrene, the film growth speed is low even if the blowing density is high.

In the case of pyrene, because the vapor pressure is low at room temperature, when the gas blowing density is made high, breaking down of the source gas itself becomes a problem, and it can be confirmed that the film growth speed does not reach that of phenanthrene. From these experimental facts it can be understood that phenanthrene is the most appropriate, followed by pyrene.

Therefore, taking the limits where the FIB is 30 keV gallium ions, the beam current is 0.4 pA and the beam diameter is 7 nm to give a fine beam (in this case, the spot current density is 1.0 A/cm$^2$, which is approximately one digit lower compared with during normal processing), when supply of phenanthrene source gas is sufficiently plentiful, the FIB and source gas are released to give a spot beam (beam that does not scan), the deposition film becomes a uniformly thick column of 80 nm in diameter growing in height in proportion to time (10 μm/100 secs).

It can also be understood that there is slightly faster growth (14 μm/100 sec) with a slightly thicker column diameter of 90 nm with a current of 0.8 pA.

(3) A process for forming a three-dimensional structure with a single stroke using FIB ultra-low speed scanning.

A description is given in (2) above of a process for breaking down and polymerizing the source gas attraction film using an FIB spot beam and a description is now given of the case of scanning with a beam at ultra-low speed. Considering what kind of speed an ultra-low speed is, this can be anything from one tenth to ten times the carbon column growth speed of 100 nm/sec, i.e. from 10 nm/sec to 1 μm/sec. Further, the beam step width is assumed to be in the order of 8 nm, i.e. 10% of the diameter of the carbon column. The deposition column under these kinds of deposition conditions is a single-write solid structure along the beam scanning trajectory.

On the other hand, when the beam scanning speed is fast, the deposition column grows horizontally along the sample surface without taking off into the air. Related deposition is only executed under these kinds of conditions. In this case, because the speed of movement of the beam is high, the deposition surface area per unit time becomes broad, i.e. the beam current density per deposition surface area falls, and it is therefore no longer necessary for the incident density of the source gas to be still higher.

Phenanthrene gas is used in the present invention. This means that a density for the incident gas that is in the region of one digit higher that that of the related art can be implemented. A three-dimensional structure can therefore be formed simply and at high-speed with a single write operation. When the gas density is low, irradiation of the beam is blanked at high speed each irradiation point so as to provide intermittent irradiation so that if the beam current density is lowered in an effective manner, and a three-dimensional structure can be formed with a single write process. However, this method does have two drawbacks. One drawback is that the growth speed is slow. Another drawback is that the influence of blanking a large number of times causes the base to be dragged (i.e. causes the shape of the three-dimensional structure to become distorted).

When the concentration of phenanthrene is taken to be a concentration higher (by five to ten times) than that used during forming of a protective film for preventing damage to the surface of the sample for a related semiconductor device etc. due to sputtering etching, growth is both rapid and stable. Blowing out from the gas gun is therefore carried out under the same conditions in all directions or in symmetrically positioned direction so as to achieve growth that is not anisotropic.

Further, by making the beam current less than 1 pA, halting scanning, stopping the beam and then carrying out beam irradiation, it is possible to form an extremely fine deposition layer of 100 nm. With current technology it is possible to form three-dimensional structures with diameters of 0.08 microns as a minimum dimension for deposition.

As the growth is extremely rapid and stable, when the source gas is specified as phenanthrene, the three-dimensional body formed is carbonic. When the desired physical properties obtained for the three-dimensional structure such as, for example, modulus of elasticity, conductance, thermal conductivity, corrosion resistance and reactivity are not sufficient with just carbon, the properties are adjusted to satisfactory physical properties by laminating different materials using plating or CVD techniques on a carbon core portion taken as the three-dimensional structure. Further, the structure can also be subjected to sputter etching or chemical etching so that compatibility with various needs can be provided.

Next, some ion elements of the irradiated ion beam remain within the three-dimensional structure made using the method of the present invention, so that, for example, when a biotechnological relationship is employed where it is extremely undesirable for there to be any content of metals such as gallium, it is necessary for this undesirable content to be removed. This technology is described in the following.

The inventor found that when a structure formed using gallium ions and phenanthrene gas is heated to more than 600 degrees centigrade in a vacuum, minute droplets of gallium introduced to within the structure cohere to the surface of the structure. Gallium that has cohered to the surface due to this phenomena is removed using the following method.

① When the structure to the surface of which minute droplets of gallium have become adhered is heated to 900 to 1000 degrees centigrade, all of the gallium is removed by evaporation within ten minutes. It is also confirmed that as the heating temperature is 1000 degrees centigrade or less, there is no influence due to change in or evaporation of the substrate of silicon with a melting point of 1410 degrees centigrade and the carbon structure.

② As a method for cases where the high temperature heating processing of ① is inconvenient due to the relationship of the materials etc., droplets of halogen gas such as chlorine gas are blown to give barium halide for which the evaporation pressure is high, in order to eliminate volatility. It can be confirmed that gallium cohering once to the surface remains on the surface even if the temperature is lowered. This reaction can therefore be implemented as the temperature falls below 600 degrees centigrade.

③ A further method is also provided for dissolving gallium adhered to the surface for removal by soaking the structure in an alkali solution such as ammonia solution from when the structure is at normal temperature.

FIRST EMBODIMENT

Figure 1A:
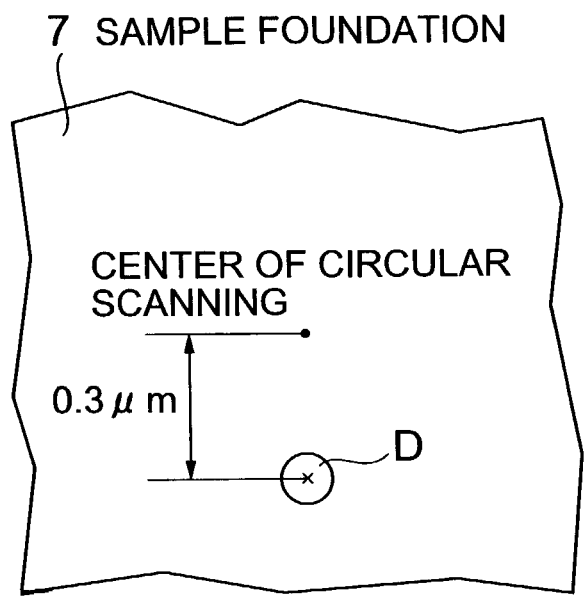
FIG. 1A is a plan view of a region irradiated with an ion beam and FIG. 1B is a perspective view of the structure of a generated coil.
Figure 1B:
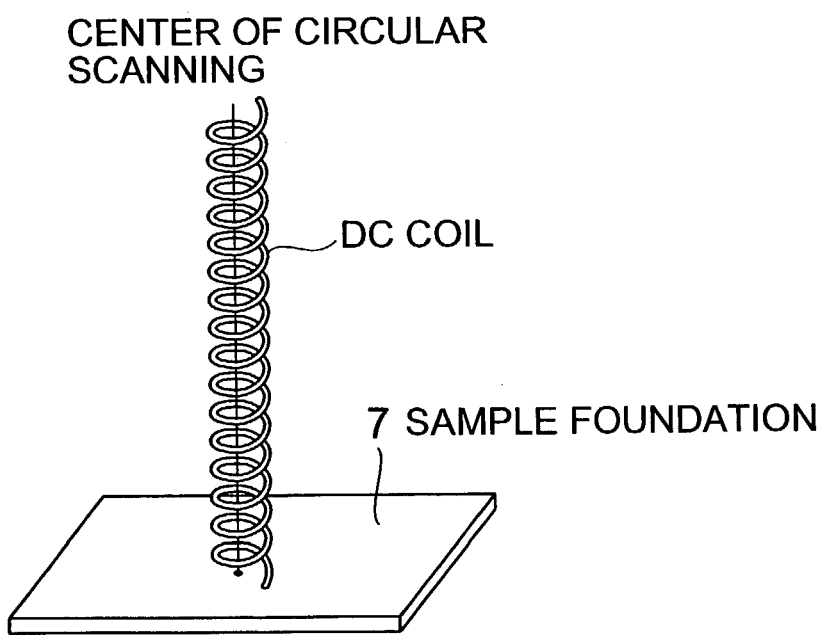

An example of making an ultrafine coil using the method of the present invention is shown in FIG. 1. The ions are taken to be 30 keV gallium ions from a liquid metal ion source and beam current is taken to be 0.4 pA. Diameter of the beam spot can be focused to 7 nm at this time for this FIB device used by the present inventor. The source gas is taken to be phenanthrene, the location of the gas gun and the heating conditions are as described above, and blowing is performed both symmetrically and at high density. The beam scanning the sample 7 is taken to be a circle of diameter 0.6 μm, with the time for scanning the circumference once being thirteen seconds, and the time for twelve times around being 156 seconds. (refer to FIG. 1A). This is straightforward from when control of beam deflection by the deflector is stabilized. The beam step width at this time is 16 nm and the beam irradiation time per step is 110 msecs. The beam scanning speed therefore becomes 145 nm. Under these conditions, the dimensions of the coil DC made under these conditions are coil diameter 0.6 μm, coil pitch 0.7 μm, coil wire diameter 80 nm, and coil length 8.4 μm. (refer to FIG. 1B).

SECOND EMBODIMENT

Figure 2A:
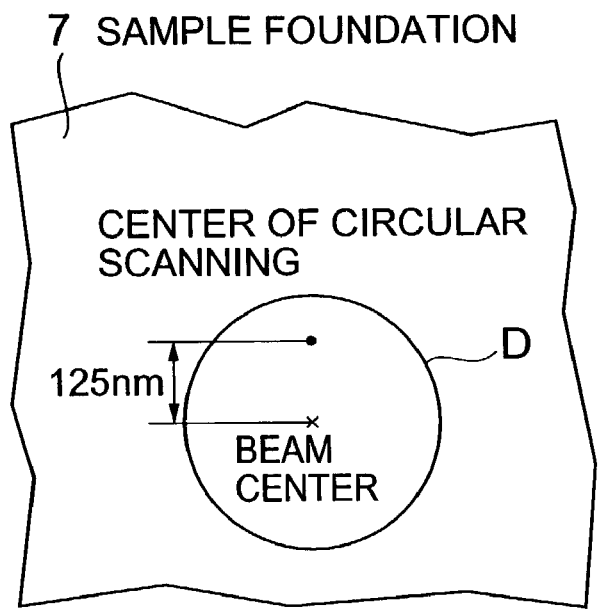
FIG. 2A is a plan view of a region irradiated with an ion beam and FIG. 2B is a perspective view of the structure of the generated drill.
Figure 2B:
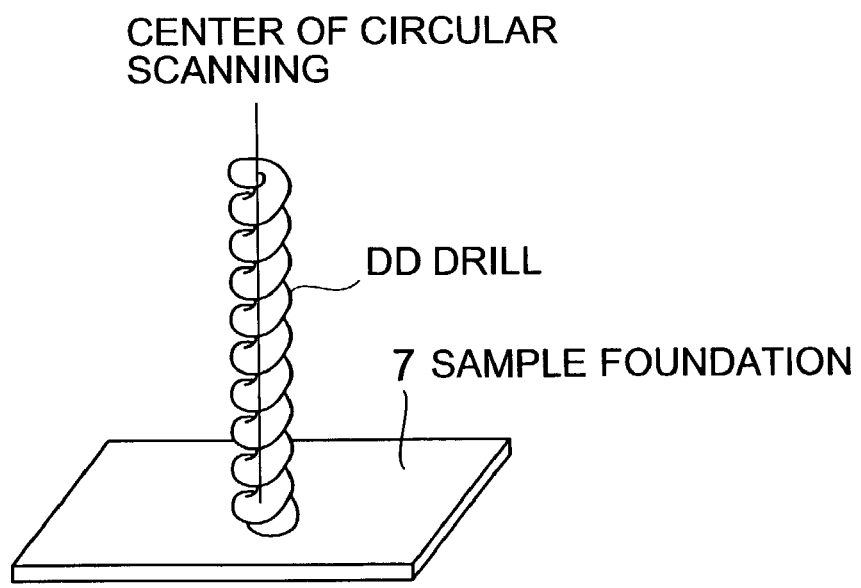

An example of making an ultra-fine drill using the method of the present invention is shown in FIG. 2. Beam current is taken to be 0.8 pA, and beam diameter is taken to be 93 nm. The diameter of the deposition layer column during halting of the beam under these conditions is broadened by 72 nm due to scattering to 165 nm and corresponds to D in the drawing. The ion type and source gas are the same as for the first embodiment. The beam scanning the sample is taken to be a circle of diameter 250 nm, with the time for scanning the circumference once being 6.4 seconds, and the time for ten times around being 64 seconds. (refer to FIG. 2A). The beam step width at this time is 16 nm and the beam irradiation time per step is 130 msecs. The beam scanning speed therefore becomes 123 nm. The dimensions of a drill DD made under these conditions are an outer diameter of 330 nm, a pitch of 200 nm and a length of 2 μm. (refer to FIG. 2B). For reference, focal depth at this time is in the region of 10 μm and focal correction is not carried out during deposition. This is the same as for the first embodiment. When deposition height exceeds focal depth, the focal point is sequentially corrected in line with the speed of growth of the height and it can be ensured that there is no blooming at the upper end of the deposition product. Further, when a deposition structure with a height exceeding 100 μm is made, deposition is temporarily halted when the height reaches, for example, 100 μm, a Z-axis of the sample stage is activated so that the sample height is lowered, and the upper end of the deposition structure is returned to the original height.

Next, the focal position is returned to the original location, normal image capture scanning is carried out, and the position of the deposition structure is confirmed. Deposition is then restarted from when the beam position is lined up when deposition is continued and growth may then be repeated until the desired height is reached.

INDUSTRIAL APPLICABILITY

In the present invention, with deposition technology using a focused ion beam device, phenanthrene is used as a source gas, ions of gallium or gold, silicon or beryllium etc. of energies of 5 to 100 keV from a liquid-metal ion source are used as ions so as to give a gas blowing density of five to ten times greater than the case of deposition in the related art, so as to make it possible to form ultra-fine three-dimensional structures that were difficult to form with related processes in a straightforward and rapid manner.

It is also possible to implement deposition layer growth that is not anisotropic by implementing direction blowing of gas during this time in a isotropic or symmetrical manner.

It is therefore possible to form a three-dimensional structure with a minimum diameter of 0.08 μm for the deposition dimensions as a result of making the beam current 1 pA or less so that beam scanning can be much slower than the case in deposition of the related art.

The present invention adopts a sample stage that can be driven along five axes (x, y, z directions, rotation, and inclination) as a focused ion beam device, a region of the sample that is irradiated with an ion beam is shifted according to the direction of growth of the sample, and in order to adjust the focal point of the beam in line with the region being processed according to growth, first, an ion optical system is controlled, with the stage being driven when this range is exceeded so as to form a three-dimensional structure. This gives a forming method that is compatible with a wide variety of ultra-fine three-dimensional structures.

Gallium injected by ion irradiation as necessary is heated to 600 degrees centigrade and above in a vacuum. After the injected gallium element coheres in the form of small droplets, it is possible to remove these droplets by evaporation by again heating to temperatures of 900 to 1000 degrees centigrade.

By then forming layers of desired material using plating or other CVD techniques on the three-dimensional structure formed using the method of the present invention or by implementing appropriate etching, it is possible to provide ultra-fine three-dimensional structures with physical properties compatible with a wide range of processing regulation.

The invention claimed is:

1. A method for forming a three-dimensional structure having a generally non-planar shape, comprising the steps of:

irradiating a focused ion beam having an energy in the range of 5 to 100 keV onto a desired region of a substrate using a liquid ion source for producing ions;

blowing phenanthrene source gas at a pre-set blowing density toward the desired region of the substrate to react with the focused ion beam to deposit a carbon film, the pre-set blowing density of the phenanthrene gas being set by raising the temperature of a container of phenanthrene to a temperature where phenanthrene gas from the container deposits on the substrate, then lowering the temperature of the container to a critical temperature at which the phenanthrene gas no longer deposits on the substrate, and then further lowering the temperature of the container to a temperature a few degrees lower than the critical temperature; and progressively moving the focused ion beam in a predetermined manner such that the deposited film grows into the three-dimensional structure.

2. A method of forming a three-dimensional structure according to claim 1; wherein the step of blowing the phenanthrene source gas is performed in a directional manner that is isotropic or symmetrical.

3. A method of forming a three-dimensional structure according to claim 1; wherein the step of irradiating the focused ion beam is performed with a spot current density of the ion beam being $1A/cm^2$ or less, a scanning speed of the ion beam is in the range of $1/10$ to 10 times the thickness growth speed of a deposited layer column that is grown with the focused ion beam in a stationary state, and a beam step width of the focused ion beam is smaller than a diameter of the deposition layer column.

4. A method of forming a three-dimensional structure according to claim 3; wherein the step of irradiating the focused ion beam is performed with a beam current of the focused ion beam being 1 pA or less to enable formation of the three-dimensional structure with a deposition layer column diameter of 100 nm or less.

5. A method of forming a three-dimensional structure according to claim 1; wherein the step of irradiating the focused ion beam is performed using a focused ion beam device having a liquid ion source, an optical system for focusing ions emitted from the liquid ion source, and a sample stage that can be driven in five directions comprised of x, y and z, rotation, and inclination; and the step of successively moving the focused ion beam in a predetermined manner comprises controlling the optical system to control the focal point of the beam to control growth of the film, and then controlling the sample stage to control growth of the three-dimensional structure when the range of control of the optical system is exceeded.

6. A method of forming a three-dimensional structure according to claim 1; wherein the liquid ion source produces gallium ions; and further comprising the steps of heating the three-dimensional structure in a vacuum to a temperature of 600° C. to cause injected gallium ions to cohere and form droplets; and heating the three-dimensional structure to 900° C. to 1000° C. to cause the droplets to evaporate.

7. A method of forming a three-dimensional structure according to claim 1; wherein the liquid ion source produces gallium ions; and further comprising the steps of heating the three-dimensional structure in a vacuum to a temperature of 600° C. to cause injected gallium ions to cohere and form droplets; and blowing a halogen gas to produce gallium halide to eliminate the droplets through volatility.

8. A method of forming a three-dimensional structure according to claim 1; wherein the liquid ion source produces gallium ions; and further comprising the steps of heating the three-dimensional structure in a vacuum to a temperature of 600° C. to cause injected gallium ions to cohere and form droplets; and cooling and soaking the three-dimensional structure in an alkali solution to dissolve and eliminate the droplets.

9. A method of forming a three-dimensional structure according to claim 1; further comprising the step of forming a layer on the three-dimensional structure by plating or chemical vapor deposition.

10. A method of forming a three-dimensional structure according to claim 1; wherein the step of progressively moving the focused ion beam comprises moving the focused ion beam in a circular manner so that the deposited film grows primarily in a vertical direction.

11. A method of forming a three-dimensional structure according to claim 1; wherein the step of progressively moving the focused ion beam comprises moving the focused ion beam in a linear manner so that the deposited film grows primarily in a lateral direction.

12. A method of forming a three-dimensional structure according to claim 1; wherein the irradiating step is carried out using a liquid ion source that produces ions of gallium, gold, silicon or beryllium.

13. A method for forming a three-dimensional structure having a generally non-planar shape, comprising the steps of:
    irradiating a focused ion beam having an energy in the range of 5 to 100 keV to a desired region of a substrate using a liquid ion source for producing ions;
    blowing phenanthrene source gas toward the desired region of the substrate to react with the focused ion beam to deposit a carbon film, the gas blowing density of the phenanthrene source gas being five to ten times greater as compared to using pyrene source gas under conditions that the source gas used does not deposit on the desired region of the substrate; and
    progressively moving the focused ion beam in a predetermined manner so that the deposited film grows into the three-dimensional structure.

14. A method of forming a three-dimensional structure according to claim 13; wherein the step of irradiating the focused ion beam is performed with a spot current density of the ion beam being $1A/cm^2$ or less, a scanning speed of the ion beam is in the range of $1/10$ to 10 time the thickness growth speed of a deposited layer column that is grown with the focused ion beam in a stationary state, and a beam step width of the focused ion beam is smaller than a diameter of the deposition layer column.

15. A method of forming a three-dimensional structure according to claim 14; wherein the step of irradiating the focused ion beam is performed with a beam current of the focused ion beam being 1 pA or less to enable formation of the three-dimensional structure with a deposition layer column diameter of 100 nm or less.

16. A method of forming a three-dimensional structure according to claim 13; wherein the liquid ion source produces gallium ions; and further comprising the steps of heating the three-dimensional structure in a vacuum to a temperature of 600° C. to cause injected gallium ions to cohere and form droplets; and heating the three-dimensional structure to 900° C. to 1000° C. to cause the droplets to evaporate.

17. A method of forming a three-dimensional structure according to claim 13; wherein the liquid ion source produces gallium ions; and further comprising the steps of heating the three-dimensional structure in a vacuum to a temperature of 600° C. to cause injected gallium ions to cohere and form droplets; and blowing a halogen gas to produce gallium halide to eliminate the droplets through volatility.

18. A method of forming a three-dimensional structure according to claim 13; wherein the step of progressively moving the focused ion beam comprises moving the focused ion beam in a circular manner so that the deposited film grows primarily in a vertical direction.

19. A method of forming a three-dimensional structure according to claim 13; wherein the step of progressively moving the focused ion beam comprises moving the focused ion beam in a linear manner so that the deposited film grows primarily in a lateral direction.

20. A method of forming a three-dimensional structure according to claim 13; wherein the irradiating step is carried out using a liquid ion source that produces ions of gallium, gold, silicon or beryllium.

21. A method for forming a three-dimensional structure having a general non-planar shape, comprising the steps of:
    irradiating a focused ion beam having an energy in the range of 5 to 100 keV onto a desired region of a substrate;
    blowing phenanthrene source gas at a pre-set blowing density toward the desired region of the substrate to react with the focused ion beam to deposit a carbon film, the pre-set blowing density of the phenanthrene gas being set so that a single layer of the phenanthrene gas may be formed on the desired region of the substrate; and
    progressively moving the focused ion beam in a predetermined manner such that the deposited film grows into the three-dimensional structure.

22. A method of forming a three-dimensional structure according to claim 21; wherein the step of progressively moving the focused ion beam comprises moving the focused ion beam in a circular manner so that the deposited film grows primarily in a vertical direction.

23. A method of forming a three-dimensional structure according to claim 21; wherein the step of progressively moving the focused ion beam comprises moving the focused ion beam in a linear manner so that the deposited film grows primarily in a lateral direction.

* * * * *